United States Patent [19]
Iten et al.

[11] 3,873,923
[45] Mar. 25, 1975

[54] FREQUENCY DETECTOR

[75] Inventors: Paul D. Iten, Oberrohrdorf; Jiri Mastner, Niederrohrdorf, both of Switzerland

[73] Assignee: Brown, Boveri and Company, Ltd., Baden, Switzerland

[22] Filed: Mar. 28, 1973

[21] Appl. No.: 345,784

[30] Foreign Application Priority Data

Mar. 30, 1972 Switzerland........................ 4663/72

[52] U.S. Cl.................. 325/423, 325/346, 325/349, 325/487, 331/11

[51] Int. Cl. ............................................ H04b 1/16

[58] Field of Search ........... 325/346, 349, 395, 396, 325/416, 418, 419, 420, 421, 422, 423, 487; 329/122, 123; 331/11, 14, 30, 32

[56] References Cited

UNITED STATES PATENTS 3,686,574 8/1972 Niman ................................ 325/421

*Primary Examiner*—Robert L. Griffin
*Assistant Examiner*—Marc E. Bookbinder
*Attorney, Agent, or Firm*—Toren, McGeady and Stanger

[57] ABSTRACT

In the disclosed frequency detector, a mixer heterodynes the detector input frequency and the detector output frequency to produce a beat frequency. A frequency discriminator circuit controls an output oscillator on the basis of the departure of the beat frequency from the tuning frequency to which the discriminator circuit is tuned. The oscillator output represents the detector output and is fed back to the mixer to form a loop. In the discriminator circuit, an operating discriminator is tuned to a desired reference frequency by periodically disconnecting the operating discriminator from the loop, applying an accurate reference signal to the discriminator, and feeding the discriminator output into a frequency adjustor until the output reaches a null. A storage device in the feedback circuit memorizes the null producing adjustment voltage and keeps applying it to the adjustor after the discriminator is reconnected into the loop. Preferably, two discriminators are alternately tuned and connected into the loop.

13 Claims, 7 Drawing Figures

FREQUENCY DETECTOR

BACKGROUND OF THE INVENTION

This invention relates to frequency detectors, and particularly to frequency detectors with follow-up control circuits.

In the type of frequency detectors with which this invention is concerned, a heterodyne mixer heterodynes the detector input frequency and the detector output frequency. An intermediate frequency amplifier passes a resulting beat frequency to a frequency discriminator. The latter controls an output oscillator on the basis of the departure of the beat frequency from a predetermined value. The output of the oscillator is fed back as one of the frequency inputs to the mixer to form a loop. The oscillator output also forms the output of the detector.

More specifically, in the detector, the input frequency to be determined serves as a command variable, and a controllable output frequency forming the detector output signal serves as a controlled variable. An output frequency control signal serves as a manipulated variable. The follow-up control signal involves a heterodyne or mixer that heterodynes the input frequency with the output frequency. A cascade-connected frequency discriminator serves as a comparator between a nominal value and an actual value, and an oscillator controlled in response to the output signal of the discriminator acts as a final control element.

Such frequency detectors have a wide range of applications in the amplification or conversion of frequency-modulated oscillations and other variable frequency signals, namely as follow-up or feedback receivers. Depending upon the type of heterodyne or mixer used, such as a product modulator, and on the type of frequency filtering, for example by a band pass filter having a given band center frequency in a specific pass band, the control of the output frequency of the oscillator is produced additively or subtractively with respect to a null frequency. The latter is determined by a discriminator circuit.

The null frequency is the particular frequency which, when applied to the input of the discriminator circuit, generates a reference value such as a zero output signal. This reference value indicates that the controlled variable and the command variable have achieved the equillibrium corresponding to the compensated conditions of the follow-up control circuit, at which the output frequency is a measure of the input frequency, defined by the size of the null frequency. When the output of the discriminator departs from the reference value, the follow-up control circuit tends toward this compensated state by controlling the oscillator.

According to the foregoing considerations, the time constant of the null frequency acting in the discriminator circuit and determining the complementary representation of the input frequency by the output frequency determines the long-range accuracy of the detector.

Frequency-determining elements of the discriminator circuit are subject to comparatively slow variations which are due primarily to thermal influences, but also to aging phenomena. These result in corresponding variations of the output frequency.

An object of the present invention is to improve circuits of this type.

Another object of this invention is to provide a frequency detector which is characterized by the high constancy of the correlation between input and output frequencies.

SUMMARY OF THE INVENTION

According to a feature of this invention, these objects are attained, in whole or in part, by periodically applying a reference frequency to the discriminator while memorizing a value needed to tune the discriminator to mull and using the memorized value later to maintain that null frequency.

More specifically, the frequency discriminator circuit has at least one discriminator which can be connected into the follow-up control circuit and alternately coupled to a null frequency adjustor, with available zero frequency and a setting input. The discriminator circuit further has at least one compensating circuit connected to the null frequency adjustor. The compensating circuit establishes an operating connection between the output and the adjustor of the discriminator, which adjusting connection balances the discriminator output signal with regard to a given reference quantity. Storage means in operative connection with the adjustor and the discriminator are provided to maintain the balanced state of the discriminator when the latter is connected into the follow-up control circuit.

By virtus of these features, the discriminator is retuned or balanced intermittently to produce the proper null frequency. This intermittent returning or balancing occurs at predetermined time intervals, each time with an accuracy which aside from the regulating accuracy of the compensating circuit, depends mainly on that of the null adjustment and its output frequency. If ordinary frequency standards are used, high degrees of accuracy can be obtained. The rate at which a null frequency varies in normal frequency discriminators is comparatively low. The intervals during which the predetermined reference frequency is applied for balancing the discriminator or adjusting it is selected accordingly.

According to another feature of the invention, an extra discriminator, which is similarly adjusted to the desired reference frequency, replaces the discriminator to be adjusted during the adjusting interval. The discriminators are then used alternately. In this way, one discriminator operates within the detector while the other discriminator is connected to a compensating circuit and the null frequency adjustment. Extensive times are therefore available for balancing each discriminator and for maintaining it in the balanced state.

Because of the latter features, brief interruptions of the detector operation, which are sometimes undesirable, are unnecessary for balancing the discriminator. The features also reduce the expenditure normally necessary for rapidly switching the discriminator from its connection to the reference frequency generator and the detector.

Switching the discriminator or the discriminators into and out of the detector and from and to the balancing circuit can be accomplished at a predetermined switching rate. It is thus possible to operate the frequency detector over long periods of time with high precision and without attendants.

These and other features of the invention are pointed out in the claims. Other objects and advantages of the invention will become evident from the following detailed description when read in light of the accompanying drawings.

DETAILED DESCRIPTION OF PREFERRED EMBODIMENTS

Figure 1:
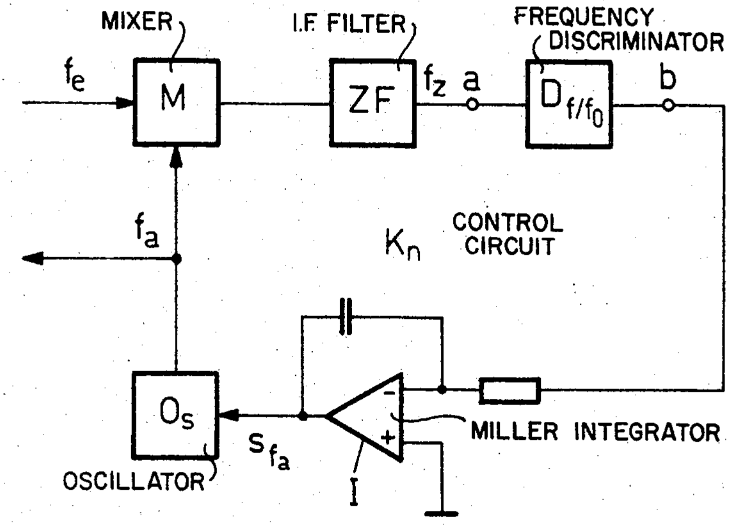
FIG. 1 is a block diagram of a known frequency detector using a follow-up control circuit, which detector, when using the details of FIGS. 2, 3, 4, 6, and 7, embodies features of the invention.

In FIG. 1, an intermediate frequency $f_z$ is determined in a follow-up control circuit $K_n$. The intermediate frequency $f_z$ is formed by a mixer or heterodyne in the form of a product modulator M which additively or subtractively heterodynes an input frequency $f_e$ with an output frequency $f_a$ and by an intermediate frequency filter ZF. The intermediate frequency $f_z$ passes to a frequency discriminator circuit $D_f$ which is tuned to a null or balance frequency $f_0$.

The term null frequency is used herein to designate the frequency at which the discriminator $D_f$ produces a null in the characteristic S-curve at the output of a frequency discriminator. It may also be referred to as the null-producing frequency, the balance frequency, or the zero frequency, It may also be referred to as the tuned or tuning frequency of the discriminator circuit. The follow-up control circuit is also referred to as a feedback loop.

If the intermediate frequency $f_z$ appearing at the input a of the discriminator circuit $D_f$ is identical with the null or tuned frequency $f_0$, the output at the terminal b of the discriminator will exhibit a voltage value of zero. When the intermediate frequency $f_z$ appearing at the input a departs from the tuned or null frequency of the discriminator circuit $Dt_f$, a voltage corresponding to the direction of deviation appears at the output or terminal *b*.

For this purpose the intermediate frequency filter $f_z$ exhibits a suitable pass band extending to both sides of the null frequency $f_0$ of the discriminator circuit. Thus, signal amplitudes departing from the null frequency of the discriminator circuit in both directions are available for producing deviation signals of both polarities. If the intermediate frequency $f_z$ represents either a beat frequency which corresponds to the sum of the frequencies applied to the product modulator M, and the intermediate frequency $f_z = f_0$, then in balanced operation of the entire circuit, $f_e = f_0 \pm f_a$. This correlation can be achieved by tuning the null frequency of the discriminator and the midband of the intermediate frequency filter $f_z$ above or below the frequency range of the input frequency $f_e$ expected.

An operational integrator I such as a Miller integrator responds to the frequency discriminator $D_f$ and applies the resulting output signal $S_{fa}$ to adjust the frequency of a variable frequency oscillator $O_s$. The output of the oscillator $O_s$ represents the output signal $f_a$ which is also fed back to the heterodyning mixer or product modulator M. This connection forms the follow-up control circuit or feedback loop $K_n$. The latter has a controlled variable output frequency $f_a$. Its command variable is the input frequency $f_e$. Its manipulated variable is the control signal $S_{fa}$. The discriminator circuit $D_f$ represents a comparator for comparing an actual value with a nominal value, and the oscillator $0_s$ represents the final control element.

Figure 2:
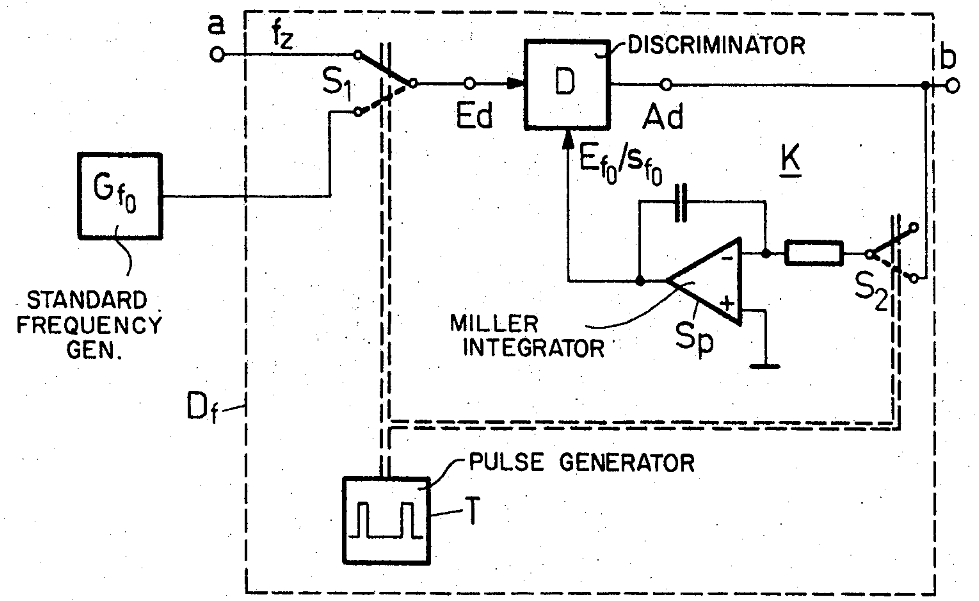
FIG. 2 is a block diagram of a discriminator circuit embodying features of the invention, and which, when used in place of the discriminator circuit in FIG. 1, produces a detector embodying features of the invention.

The aforementioned relation between the input frequency, output frequency, and null frequency shows specifically how the reproduction fidelity of the detector generally and the reproduction constancy of the detector, in particular, depend upon the null frequency. The circuit of FIG. 2 illustrates a discriminator circuit, which, when used between the input *a* and the output *b* of FIG. 1, serves to maintain the null frequency constant. This is done by intermittent compensation.

The essential parts of the discriminator circuit $D_f$ of FIG. 2 are a discriminator D with an input $E_d$, an output $A_d$ and a tuned frequency setting input $E_{f0}$, as well as a compensating circuit K. The latter includes a storage device $S_p$ between the output $A_d$ and the frequency setting input $E_{f0}$. A pulse generator T operates two coupled switches $S_1$ and $S_2$. The switches are shown as throw switches but may be electronic switches.

In FIG. 2 the switches are shown connecting the discriminator into the detector. Specifically, the switch $S_1$ connects the discriminator into the feedback control circuit $K_n$ of FIG. 1. The null frequency $f_0$ of the discriminator D is determined by the setting signal $S_{f0}$ appearing at the setting input $E_{f0}$. A storage device $S_p$ in the form of a Miller integrator which is set to a defined output value keeps the signal $S_{f0}$ constant while the discriminator D is connected into the path between the terminals *a* and *b*. The Miller integrator is a high gain amplifier with a differential feedback so that it exhibits an integral transition behavior. In effect, with its input resistor, it represents an operational integrator. While the discriminator is operating between the inputs *a* and *b* as part of the control circuit $K_n$, the switch $S_2$ disconnects the input of the integrator from the output $A_d$ of the discriminator. Thus, the output of the integrator forming the storage device $S_p$ remains relatively constant with a high degree of accuracy over comparatively long time intervals.

A pulse generator T determines the time during which the discriminator D is connected between terminals *a* and *b*. After this operating period, the switch $S_1$ separates the discriminator D from the follow-up control circuit $K_n$ and connects the input of the discriminator D to a frequency standard $G_{f0}$ that generates the reference frequency $f_0$ At the same time, the switch $S_2$ completes a compensating feedback circuit K by connecting the input of the Miller integrator storage device $S_p$ to the output $A_d$ of the discriminator. The compensating circuit K represents a separate control circuit in which the discriminator D behaves as a comparator for comparing a nominal value with an actual value and the storage device $S_p$ serves as an integral setting element.

The discriminator D operates by producing a zero output signal when the input frequency coincides with its tuned or null frequency. This null frequency is determined by the operating parameters of the discriminator and by the correcting signal $S_{f0}$. If the tuned or null frequency at which the discriminator is supposed to produce a zero output deviates from the nominal value supplied by the frequency standard $G_{f0}$, a deviation signal appears at the output $A_d$. The latter is integrated by the Miller integrator storage device $S_p$. The latter varies the setting signal $S_{f0}$ to retune the discriminator. The null frequency of the discriminator is adjusted to the nominal value frequency $f_0$ generated by the frequency standard $G_{f0}$ with the high accuracy of an integral regulator.

Subsequently, when the switches $S_1$ and $S_2$ are switched from the positions opposite to that shown in FIG. 2 (i.e., by phantom lines) back to the positions of FIG. 2, the input to the storage device $S_p$ is opened. This keeps the output of the Miller integrator constant during the operating period of the detector, that is during the period in which the discriminator D is connected between the terminals *a* and *b* and into the circuit $K_n$. Thus, the discriminator D remains tuned to the frequency $f_0$ while it is operating within the circuit $K_n$.

A relatively short period of time is sufficient for setting the compensating circuit K to produce the frequency $f_0$ so that the pulse generator T operates with the high keying ratio indicated in FIG. 2. The detector is thus interrupted briefly for adjusting the null frequency of the discriminator D.

Figure 3:
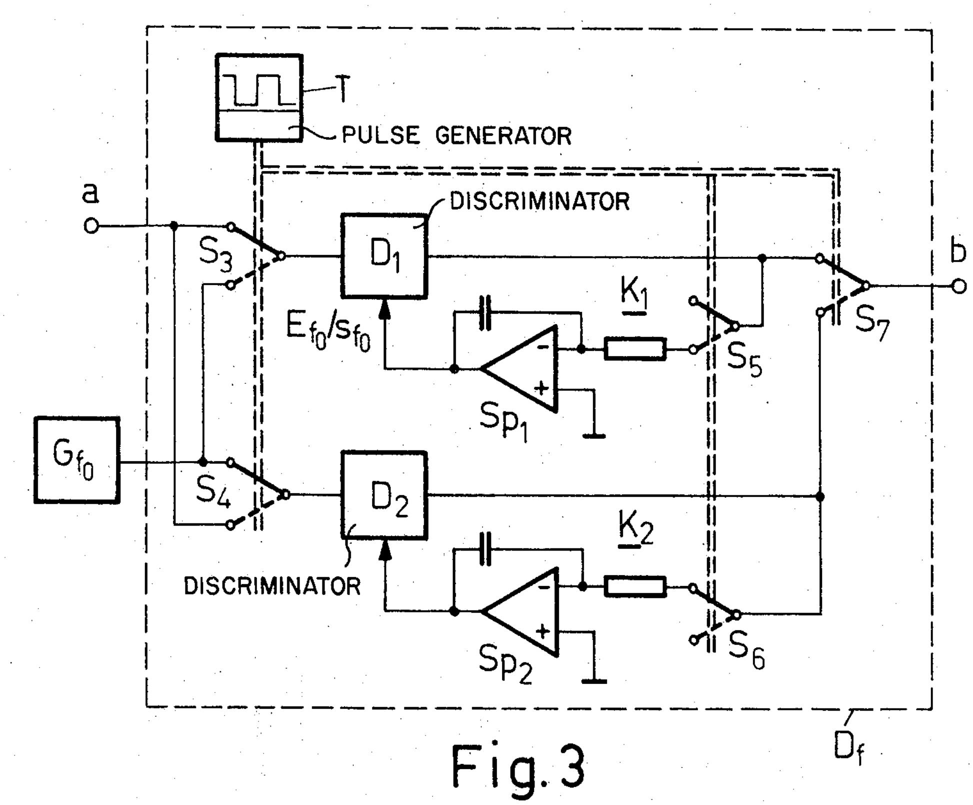
FIG. 3 is a block diagram of another discriminator circuit embodying features of the invention for use in place of the discriminator circuit of FIG. 1, so that the detector of FIG. 1, when using the discriminator circuit of FIG. 3, embodies features of the invention.

The embodiment of the discriminator circuit $D_f$ illustrated in FIG. 3 avoids the aforementioned brief interruptions in the operation of the follow-up control circuit $K_n$. Here, a switching arrangement alternately connects two discriminators $D_1$ and $D_2$ into the follow-up control circuit $K_n$ of FIG. 1. While the discriminators $D_1$ and $D_2$ are disconnected from the circuit $K_n$, they are coupled to the frequency standard $G_{f0}$ and to respectively separate compensating circuits $K_1$ and $K_2$.

In the switching arrangement, the pulse generator T actuates five coupled switches $S_3$, $S_4$, $S_5$, $S_6$, and $S_7$ simultaneously, each between two respective conditions. The switches may be electronic switches. In one of the states of the pulse generator T the switches $S_3$ to $S_7$ assume the positions shown in FIG. 3 (by solid lines). IN the other state of the pulse generator T, the switches all assume the opposite positions (shown by phantom lines). In the first state of the pulse generator T the switches $S_3$ and $S_7$ connect the discriminator $D_1$ into the loop of the circuit $K_n$ between the terminals *a* and *b*, while the switch $S_5$ disconnects the compensating circuit $K_1$ from the output of the discriminator $D_1$. At the same time, the switches $S_4$ and $S_7$ disconnect the discriminator $D_2$ from the circuit $K_n$ between the terminals *a* and *b*, while the switches $S_4$ and $S_6$ connect the input of the discriminator $D_2$ to the frequency standard $G_{f0}$ and complete the compensating loop circuit $K_2$. In the other state of the pulse generator T, the switches reverse their functions. They connect the discriminator $D_2$ into the circuit $K_n$ and apply the compensating circuit $K_1$ to the discriminator $D_1$.

The two compensating circuits $K_1$ and $K_2$ contain respective storage devices $S_{pl}$ and $S_{p2}$, both in the form of Miller integrators. Each of the devices $S_{p1}$ and $S_{p2}$ keeps the zero frequency setting signal $S_{f0}$ constant during the period in which the discriminator to which the storage device is connected operates in the circuit $K_n$ between the terminals *a* and *b*. The storage devices $S_{p1}$ and $S_{p2}$ are set during the adjusting period between the operating periods. During the adjusting period that each of the compensating circuits is active, the compensating circuits $K_1$ and $K_2$ set the signals $S_{f0}$ to values that tune the discriminators to the exact nominal frequency $f_0$ generated by the standard $G_{f0}$. In this embodiment of the invention, the pulse generator T has substantially symmetrical keying ratio. That is, it has a 50 percent duty cycle.

Figure 4:
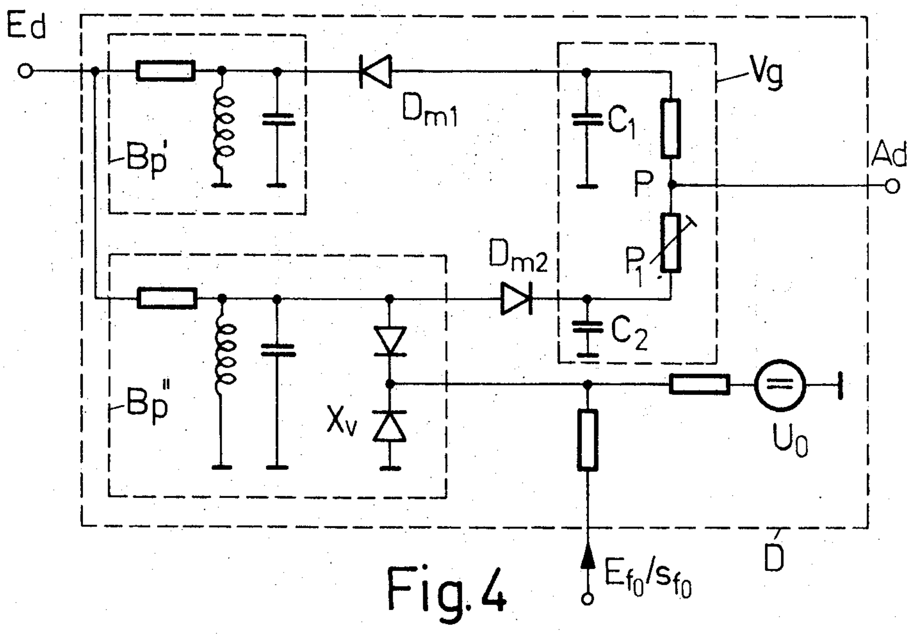
FIG. 4 is a circuit diagram illustrating details of a frequency discriminator used in FIGS. 2 and 3.

FIG. 4 illustrates a discriminator suitable for the circuits of FIGS. 2 and 3. Here, the effective tuning frequency is determined by two parallel resonant band pass filters $B_p'$ and $B_p'$. The upper side band $F_o$ of one filter and the lower side $F_u$ of the other filter are tuned to the range of the null frequency $f_0$ as can be seen from the amplitude-frequency diagram of FIG. 5. The band pass filter $B_p'$ is fix tuned, while the band pass filter $B_p''$ has a reactance element $X_v$ which is variable over the tuned frequency setting input $E_{f0}$. The reactance element $X_v$ is in the form of an opposing series connection of capacitance diodes whose effective barrier layer capacitance is controlled by the setting signal $S_{f0}$. A voltage source $V_0$ maintains the blocked state of the diodes through suitable decoupling resistances.

Figure 5:
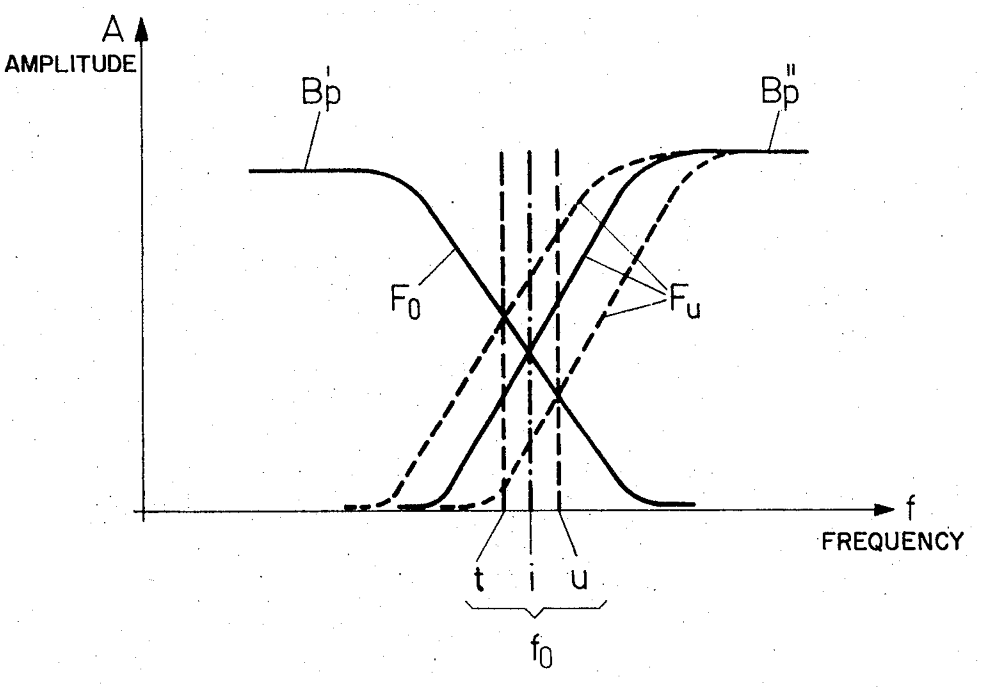
FIG. 5 is an amplitude frequency diagram illustrating a method of operating the frequency discriminator illustrated in detail in FIG. 4.

The lower side band $F_u$ of the filter $B_p''$ can be detuned in the manner shown in FIG. 5 from the center position represented by the solid lines in both directions up to the positions represented by the broken lines. The effective null frequency or balance frequency or tuned frequency is determined by the coincidence of the output amplitudes *a* of the two band pass filters. The null frequency can thus be displaced from the center position *i* to the two opposite positions *t* and *h*.

The outputs of the two band pass filters $B_p'$ and $B_p''$ are demodulated by two demodulating elements $D_{M1}$ and $D_{m2}$. As shown, these are formed by oppositely poled diodes. A comparison circuit $V_g$ compares the outputs of the demodulating elements $D_{mi}$ and $D_{m2}$ with each other by adding them to each other. In the embodiment shown, the comparison circuit $V_g$ is symmetrical. It is composed of two charging capacitors $C_1$ and $C_2$ as well as a voltage divider P whose center junction forms the output $A_d$ of the discriminator.

If the two output amplitudes of the band pass filters are identical, that is, if the intermediate frequency $f_z$ fed to the input $E_d$ coincides to the tuning frequency $f_0$,voltage null appears at the output $A_d$. where the frequency deviates from the frequency $f_0$ in one direction or the other, corresponding positive or negative voltages appear as deviation signals. A resistance $P_1$ of a voltage divider P in the form of a trimmer permits manual adjustment of the null or tuned frequency because the asymetry between the output signals of the two band pass filters can thus be compensated for.

Figure 6:
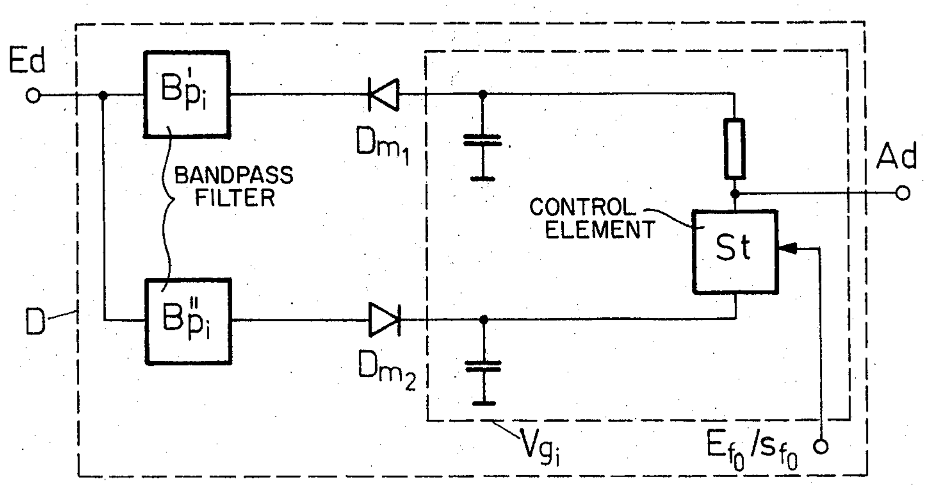
FIG. 6 is a circuit diagram illustrating another embodiment of the discriminator in FIG. 4, similarly usable in the discriminator of FIGS. 2 or 3 so as to make the detector in FIG. 1 embody features of the invention.

FIG. 6 illustrates a discriminator with two fixed tuned pass band filters $B_{pt}'$ and $B_{pt}''$. Here, the midband frequencies and the side bands of the band pass filters $B_{pi}'$ and $B_{pi}''$, which have equal band widths, can be displaced away from the null frequency by $\Delta f$ and $-66f$. This produces a frequency diagram corresponding to the solid curves of FIG. 5. A comparison circuit Vgi following demodulation elements $D_{M1}$ and $D_{m2}$ adjusts and sets the actually effective null frequency within the compensating circuits.

Figure 7:
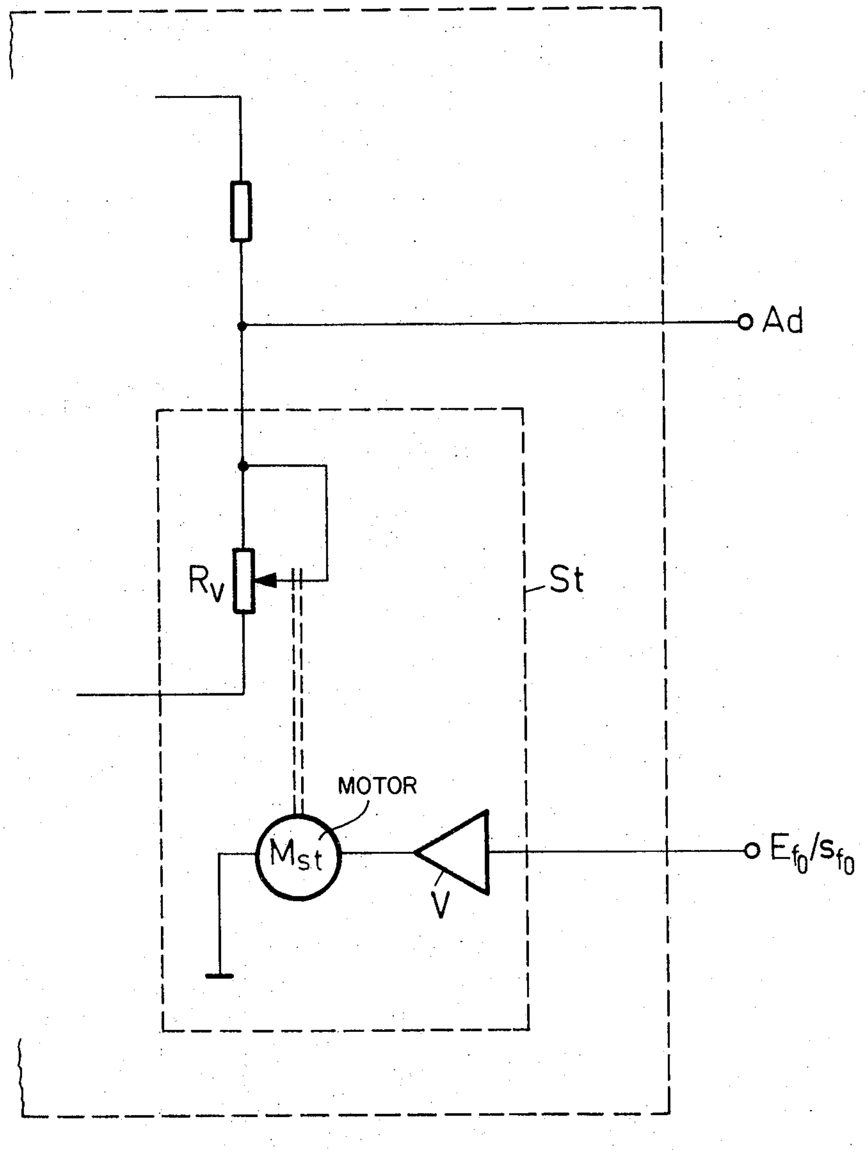
FIG. 7 is a circuit diagram of a control element for determining the null or reference frequency used in the discriminator of FIG. 6 and embodying features of the invention.

This comparison circuit is similar to the comparison circuit of FIG. 4. However, here the trimmer $P_1$ is replaced by control element St whose resistance and terminal voltage can be adjusted by the tuning frequency setting signal $s_{f0}$ at the input $E_{f0}$. According to one embodiment of the invention, this is accomplished with a control element like that in the circuit of FIG. 7 using a mechanically adjustable resistance $R_r$ and an adjusting motor $M_{st}$. A power amplifier V feeds the motor $M_{st}$ in dependence upon the setting signal $S_{f0}$.

According to another embodiment of the invention, the control element St is composed of an electronic circuit s with controllable resistances or switches. According to another embodiment of the invention, controllable compensating voltage sources are used. The latter introduce a terminal voltage that displaces the effective tuned frequency in the comparison circuit $v_{gi}$.

What is claimed is:

1. A frequency detector for producing a detector output in response to a detector input, comprising mixer means responsive to the input and the output for producing a beat frequency, frequency discriminator means defining a predetermined tuning frequency near the beat frequency and coupled to said mixer means for producing an analog signal in dependence upon the relationship between the beat frequency and the tuning frequency, variable oscillator means coupled to said discriminator means for producing the output at an output frequency which responds to the value of the analog signal, said oscillator means being coupled to said mixer means and forming a loop with said mixer means and said discriminator means, said discriminator means including a discriminator circuit tuned to the tuning frequency and a standard frequency generator for generating a reference frequency, compensating means for adjusting the tuning of said discriminator circuit, and switching means in said discriminator means for coupling said discriminator circuit into the loop while maintaining the discriminator circuit decoupled from said standard frequency generator and for periodically coupling said standard frequency generator to said discriminator circuit while coupling the compensating means to the output of said discriminator circuit, said compensating means when connected to the output of said discriminator circuit adjusting the tuning frequency to the standard frequency on the basis of the output of said discriminator circuit and maintaining the tuning of said discriminator circuit at the frequency determined by said compensating means when said switching means decouples said standard frequency generator and said compensating means from said discriminator circuit said discriminator means including a second discriminator circuit, said switching means being coupled to said second discriminator circuit and switching said second discriminator circuit into the loop when said switching means switches said first discriminator circuit out of the loop, said discriminator means including second compensating means, said switching circuit coupling said standard frequency generator to said second discriminator circuit when said second discriminator circuit is disconnected from the loop, said switching circuit connecting said second compensating means to the output of said second discriminator circuit when said second discriminator circuit is disconnected from the loop.

2. A detector as in claim 1, wherein said switching means decouples said discriminator circuit from the loop when said switching means couples said discriminator circuit to said standard frequency generator means.

3. A detector as in claim 2, wherein said compensator means includes storage means for memorizing the output of said discriminator circuit after said switching means decouples said discriminator circuit from said compensating means.

4. A detector as in claim 1, wherein said second compensating means includes storage means for memorizing the output of said second discriminator circuit after the output of said second discriminator is decoupled from said compensating means and connected into the loop.

5. A detector as in claim 3, wherein said storage means includes an operational integrator.

6. A detector as in claim 4, wherein said compensating means each includes an operational integrator.

7. A detector as in claim 1, wherein said discriminator circuits each includes a pair of band pass filters having pass bands whose center frequencies are on opposite sides of the tuning frequency of said discriminator circuit, said pass bands each having lower and upper side bands, the lower side bands of one of said filters coinciding with the upper side band of the other of said filters at the tuning frequency, comparison means responsive to each of said filters for producing a voltage output that varies with variation of the beat frequency one of said filters including a variable reactance element for varying the position of its side band within a range adjoining the tuning frequency.

8. A detector as in claim 4, wherein each of said discriminators includes two filters having pass bands whose center frequencies are on opposite sides of the tuning frequency of said discriminator circuit, said pass bands each having lower and upper side bands, the lower side bands of one of said filters coinciding with the upper side band of the other of said filters at the tuning frequency, comparison means responsive to each of said filters for producing a voltage output that varies with variation in the beat frequency, one of said filters in each of said discriminators including a variable reactance element for varying the position of its side bands within a range adjoining the tuning frequency.

9. A detector as in claim 8, wherein said comparison means includes two demodulators each connected to one of said filters.

10. A detector as in claim 8, wherein each of said comparison means includes a pair of demodulators, each of said demodulators being connected to one of said filters.

11. A detector as in claim 3, wherein said discriminator circuit includes two filters forming respective pass bands with upper and lower side bands, each of said pass bands extending at least partly to each side of the tuning frequency, the upper side band of one pass band coinciding with the lower side band of the other pass band at the tuning frequency, said filters being responsive to the beat frequency formed by heterodyning the input frequency and the output frequency, a comparison circuit responsive to each of said filters for producing a voltage output that varies with variation of the beat frequency and control means for establishing the reference value of the output signal of the discriminator, said control means being coupled to and responsive to said compensating means.

12. A detector as in claim 4, wherein each of said discriminator circuits include two filters forming respective pass bands with upper and lower side bands, each of said pass bands extending at least partly to each side of the tuning frequency, the upper side band of one pass band coinciding with the lower side band of the other pass band at the tuning frequency, said filters being responsive to the beat frequency formed by heterodyning the input frequency and the output frequency, a comparison circuit responsive to each of said filters for producing a voltage output that varies with variation of the beat frequency and control means for establishing the reference value of the output signal of the discriminator, said control means being responsive to said compensating means.

13. A frequency detector for producing a detector output in response to a detector input, comprising mixer means having a first input connected to the detector input and a second input connected to the detector output, said mixer means having an output carrying an intermediate frequency produced from said detector input and detector output, a standard frequency source, variable oscillator means having a control input and an output connected to said detector output, and frequency discriminator means including a first input coupled to the output of said mixer means and a second input coupled to said standard frequency source, said frequency discriminator means having an output operationally coupled with said control input of said variable oscillator means, said frequency discriminator means having first and second frequency discriminators each including a frequency input and a tuning input as well as tunable reference frequency defining means coupled to said tuning input, each of said frequency discriminators being constructed so as to produce an output signal significantly different from each other when the frequency at said tuning input is less or greater than the reference frequency said frequency discriminator means further including input and output switching means connected with said inputs and outputs of said frequency discriminators, and timing means operationally connected with said input and output switching means so as periodically to change these switching means between a first and second switching state, said switching means in said first said state causing said frequency discriminator to have its frequency input connected to said first input of said frequency discriminator means and said tuning input unconnected while causing the output of said first discriminator to be connected to the output of said frequency discriminator means, said switching means in the first of said states causing said second frequency discriminator to have its frequency input connected to said second input of the frequency discriminator means and its tuning input connected to the output of said second frequency discriminator, said switching means causing the corresponding inputs and outputs of said first and second frequency discriminators to interchange their respective connections, said frequency detector thus forming a negative feedback loop closed via said mixer means and said frequency discriminator means as well as said variable oscillator.

* * * * *